United States Patent
Ishiguro et al.

(10) Patent No.: US 6,812,501 B2
(45) Date of Patent: Nov. 2, 2004

(54) SEMICONDUCTOR LASER PACKAGE AND FABRICATION METHOD THEREOF

(75) Inventors: Takahide Ishiguro, Mie (JP); Osamu Hamaoka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 263 days.

(21) Appl. No.: 10/058,664

(22) Filed: Jan. 28, 2002

(65) Prior Publication Data

US 2002/0100912 A1 Aug. 1, 2002

(30) Foreign Application Priority Data

Feb. 1, 2001 (JP) ........................................ 2001-025259

(51) Int. Cl.$^7$ ...................... H01L 29/227; H01L 29/26; H01L 33/00; H01L 23/495
(52) U.S. Cl. .............................. 257/98; 257/79; 257/80; 257/100; 257/666
(58) Field of Search .......................... 257/666, 98, 100, 257/80, 79, 99; 438/123, 124

(56) References Cited

U.S. PATENT DOCUMENTS 5,668,383 A * 9/1997 Krieger ........................ 257/80
6,249,387 B1 * 6/2001 Poradish et al. ............. 359/634
6,374,021 B1 * 4/2002 Nakanishi et al. ............ 385/49
2002/0003818 A1 * 1/2002 Katayama et al. ............ 372/36

FOREIGN PATENT DOCUMENTS

| JP | 10-256649 | * | 9/1998 |
| JP | 10-256650 | * | 9/1998 |
| JP | 11233808 A | | 8/1999 |
| JP | 2000340875 A | | 12/2000 |

* cited by examiner

*Primary Examiner*—Evan Pert
*Assistant Examiner*—James Mitchell
(74) *Attorney, Agent, or Firm*—Morrison & Foerster LLP (57) ABSTRACT

A semiconductor laser package includes an island member formed of metal, including a base plane and a block member protruding in a direction substantially perpendicular to the base plane, a lead, a resin member molded integrally with the island member and the lead so as to fix the relative position relationship between the island member and the lead, a laser chip fixed at the block member, and a light receiving element functioning as a light receiving unit, directly fixed to the resin member.

11 Claims, 6 Drawing Sheets

SEMICONDUCTOR LASER PACKAGE AND FABRICATION METHOD THEREOF

BACKGROUND OF THE INVENTION

1. Field of the Invention

The present invention relates to semiconductor laser packages and a fabrication method thereof. Here, "semiconductor laser package" includes a laser diode (referred to as "laser chip" herein after) and predetermined light receiving means. The semiconductor laser package is a component with the required lines led out. This is employed as a light source in the optical pickup apparatus of an optical disc system.

2. Description of the Background Art

A conventional semiconductor laser package is disclosed in, for example, Japanese Patent Laying-Open No. 11-233808 in FIG. 2 (referred to as "first prior art"). The semiconductor laser package will be described with reference to FIGS. 7 and 8 reflecting the design concept of first prior art 1. Although the details in the structure of FIGS. 7 and 8 differ from those of first prior art 1 due to the difference in the specification of the semiconductor laser package of interest, the basical design concept follows that of first prior art 1. In the description, the reference of "up" and "down" is based on the orientation with the output direction of the laser beam of the semiconductor laser package in a vertical upward direction.

Figure 7:
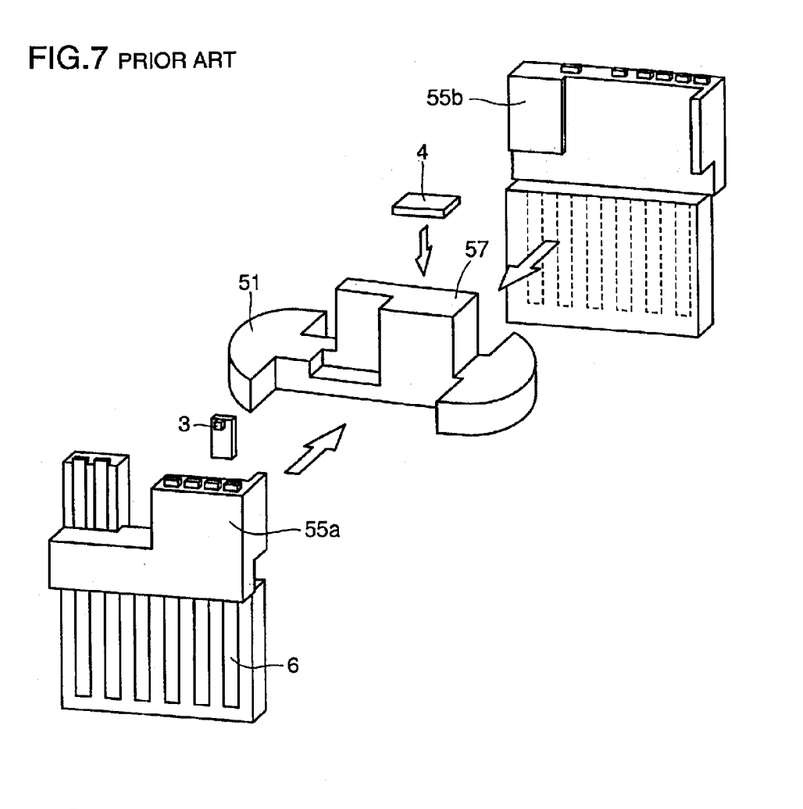
FIG. 7 is a diagram to describe a fabrication method of a semiconductor laser package according to prior art.

As shown in FIG. 7, the conventional semiconductor laser package is formed of a combination of an island member 51 and resin members 55a and 55b. Island member 51 is a metal member constituting the base where a laser chip 3 and a light receiving element 4 are mounted. Island unit 51 is formed by cold forging. A plurality of leads 6 are embedded in resin members 55a and 55b. The upper end of lead 6 is exposed above respective resin members 55a and 55b for the connection with laser chip 3 and light receiving element 4. Resin members 55a and 55b are assembled with island member 51 therebetween to be joined integrally by ultrasonic welding.

Figure 8:
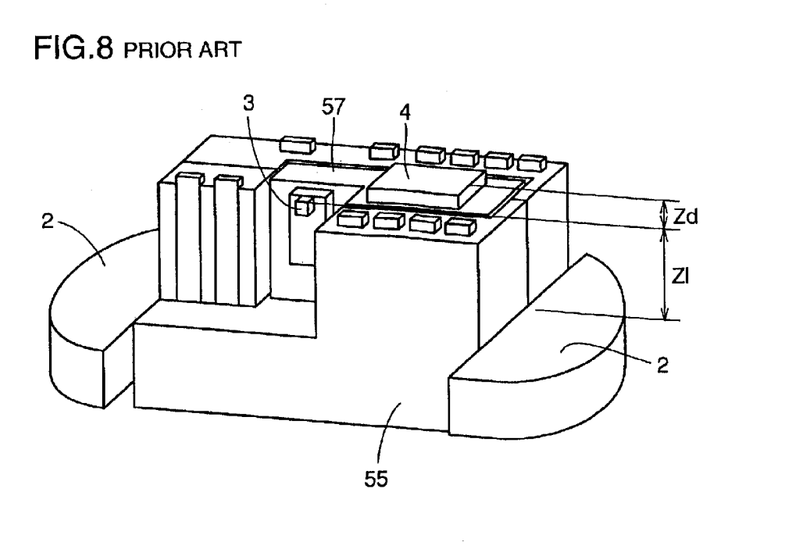
FIG. 8 is a prospective view of the main part of the semiconductor laser package according to prior art.

The main part in an assembled state is shown in FIG. 8. Although not shown in FIG. 8, laser chip 3 and light receiving element 4 are wire-bonded with the upper end of lead 6 in practice. Lead 6 also extends below island member 51.

In the conventional semiconductor laser package, laser chip 3 and light receiving element 4 are both secured to a block member 57 of island member 51, as shown in FIG. 8. Specifically, laser chip 3 is disposed at a side plane of block member 57 whereas light receiving element 4 is disposed at the top plane of block member 57. Island member 51 has a base plane 2 facing upwards. It is desired that laser chip 3 and light receiving element 4 are secured to have a predetermined position relationship with respect to base plane 2. Specifically, assuming that the height of the radiation plane of laser chip 3 from base plane 2 is Zl and the height of the light receiving plane of light receiving element 4 from the radiation plane of laser chip 3 is Zd, it is desired that Zl and Zd are set to respective design values.

Fine adjustment of the attaching position of laser chip 3 is allowed since laser chip 3 is disposed at the side plane of block member 57. Zl can be made to approximate the design value. However, the height of the top plane of block member 57 from base plane 2 is greatly variable since island member 57 is formed by cold forging. Therefore, Zd cannot be ensured to be set to the exact design value even if Zl approximates the design value. Rather, Zd will often be deviated from the design value if the accuracy of Zl is sought. Although the light emitting point of the laser beam should match the focal point of the lens in an ideal situation when incorporated into an optical pickup apparatus, deviation of Zd from the design value will result in misalignment between the light emitting point of the laser beam and the focal point of the lens, or between the light receiving plane of light receiving element 4 and the focal point of the lens to mar the balance of the focus signal.

The portion of resin members 55a and 55b holding lead 6 is apt to be thin due to the structure of holding respective leads 6. This thin region of resin members 55a and 55b will result in a weaker hold on lead 6. It is to be noted that a ultrasonic wave is applied to the wire in the process of wire bonding, whereby lead 6 is rubbed. If the hold on lead 6 is weak, lead 6 will move, resulting in the degradation of the connection accuracy between the wire and lead 6. This is particularly noticeable in a thin type semiconductor laser package in which resin members 55a and 55b are thin.

Also, since island member 51 is formed of metal and integrally, an insulator must be sandwiched between laser chip 3 or light receiving element 4 and island member 51 to electrically insulate laser chip 3 from light receiving element 4.

SUMMARY OF THE INVENTION

In view of the forgoing, an object of the present invention is to provide a semiconductor laser package and fabrication method thereof that allows approximation of both Zl and Zd to the design values, having sufficient hold of the lead, and dispensable of the aforementioned insulator.

Another object of the present invention is to provide an optical pickup apparatus.

According to an aspect of the present invention, a semiconductor laser package includes an island member formed of metal, having a base plane and a block member protruding substantially perpendicularly to the base plane, a lead, a resin member molded integrally with the island member and the lead so as to fix the relative position relationship between the island member and the lead, a laser chip fixed at the block member to allow a laser beam to be emitted in a direction substantially perpendicular to the base plane, and a light receiving unit directly fixed at the resin member. By employing such a structure, the laser chip is fixed to the block member of the island member whereas the light receiving unit is directly fixed at the resin member. Therefore, the position of the laser chip and the position of the light receiving element can be adjusted and determined independent of each other. Thus, a semiconductor laser package having the relative position between the laser chip and the light receiving unit set closer to the design value is provided.

Preferably, the resin member includes a light receiving unit attaching plane that is substantially parallel to the base plane. The light receiving unit is mounted at the light receiving unit attaching plane. By employing such a structure, the distance between the light receiving plane of the light receiving unit and the base plane can be set more accurately while fixation of the light receiving unit is facilitated.

Preferably, a heat radiator is fixed at the block member. The laser chip is fixed to the block member so as to come into contact with the heat radiator. Since the laser chip and the heat radiator are brought into contact by the above structure, the heat generated from the laser chip can be promptly discharged by the heat radiator. A semiconductor laser package of stable operation can be achieved.

Preferably, the heat radiator includes light receiving means. The reflected light can be monitored by the light receiving means.

Preferably, a hologram element is arranged to be located on an optical path of the laser beam emitted from the laser chip. By employing such a structure, the emitted light passing through the hologram element as well as reflected light can be subjected to a desired process such as dispersion.

Preferably, a cover is provided so as to enclose the laser chip and the light receiving unit. Accordingly, intrusion of foreign objects around the laser chip and light receiving unit can be prevented. A stable semiconductor laser package can be provided.

A fabrication method of a semiconductor laser package according to the present invention includes a resin molding step of molding integrally with resin an island member formed of metal including a base plane and a block member protruding from the base plane substantially in a normal line direction to the base plane and a lead so as to secure the relative position relationship between the island member and lead, a laser chip attaching step of fixing a laser chip at the block member to enable emission of a laser beam in the normal line direction of the base plane, and a light receiving unit attaching step of fixing the light receiving unit at the resin member. By such a method, the relative fixation between the island member and the lead can be effected by the molding of the resin member. Since the laser chip is fixed to the block member and the light receiving unit is fixed to the resin member, the position of the laser chip and the light receiving unit can be adjusted and determined independent of each other. Therefore, a semiconductor laser package having the relative position between the laser chip and the light receiving unit set closer to the design value can be achieved.

Preferably, in the resin member molding step, the island member and the lead are arranged in the same resin mold die and subjected to resin molding. By this method, the resin member can be molded so as to maintain the island member and the lead at the desired relative position relationship by one resin mold process.

Preferably, the fabrication method includes an island member formation step of forming the island member by cold forging. By employing this method, fabrication of the island member is facilitated.

Preferably, the lead is formed by press-working and applying a bending process. By employing such a method, fabrication of the lead is facilitated.

To achieve the above objects, the optical pickup apparatus of the present invention includes a semiconductor laser package described above, and a lens. The lens is fixed so that the focal point substantially matches the emission point of the laser chip. By employing such a structure, an optical pick up apparatus having superior characteristics without unbalance of the focus signal can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor laser package according to a first embodiment of the present invention will be described with reference to FIG. 1. The semiconductor laser package mainly includes an island member 1 and a resin member 5. Island member 1 has a base plane 2 facing upwards. A light receiving unit attaching plane 22 is provided at the upper side of resin member 5. Light receiving unit attaching plane 22 is substantially parallel to base plane 2. A light receiving element 4 is mounted as a light receiving unit on light receiving unit attaching plane 22. Island member 1 includes a block unit 7 protruding upwards from base plane 2. A laser chip 3 is fixed at a side plane of block member 7. Laser chip 3 is fixed with the light emitting plane facing upwards so that a laser beam can be emitted upwards in a substantially vertical direction with respect to base plane 2. It is to be noted that, in the example of FIG. 1, laser chip 3 is fixed to block member 7 via a submount 21 functioning as a heat radiator to promptly discharge the heat generated from laser chip 3. Submount 21 includes a light receiving element for monitoring.

A lead 6 extends above and below base plane 2. The lower end of lead 6 has a portion exposed in a manner held by resin member 5 to enable connection with another component. The upper end of lead 6 has a portion exposed or protruding from resin member 5 in a manner held by resin member 5. The required electrical connection between the projecting upper end or exposed side plane of lead 6 from resin member 5 and laser chip 3 or light receiving element 4 is effected through wire bonding.

Figure 2:
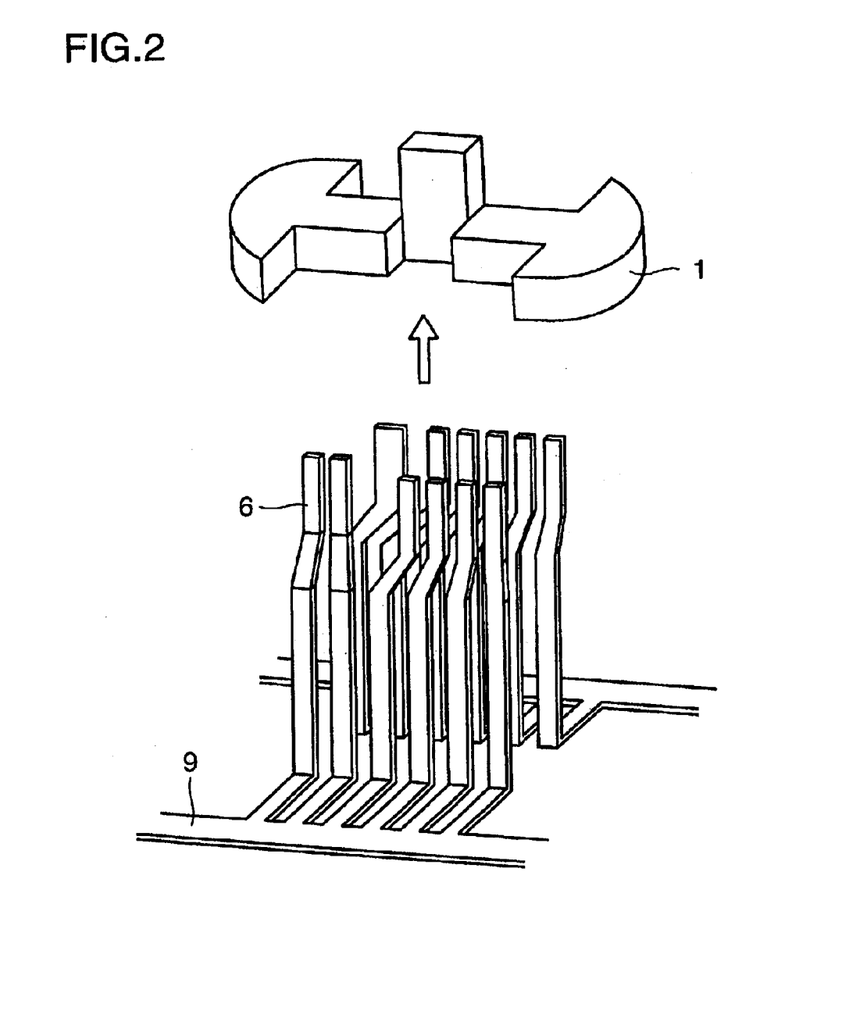
FIGS. 2 and 3 are diagrams of the semiconductor laser package of the first embodiment corresponding to a fabrication method thereof.
Figure 3:
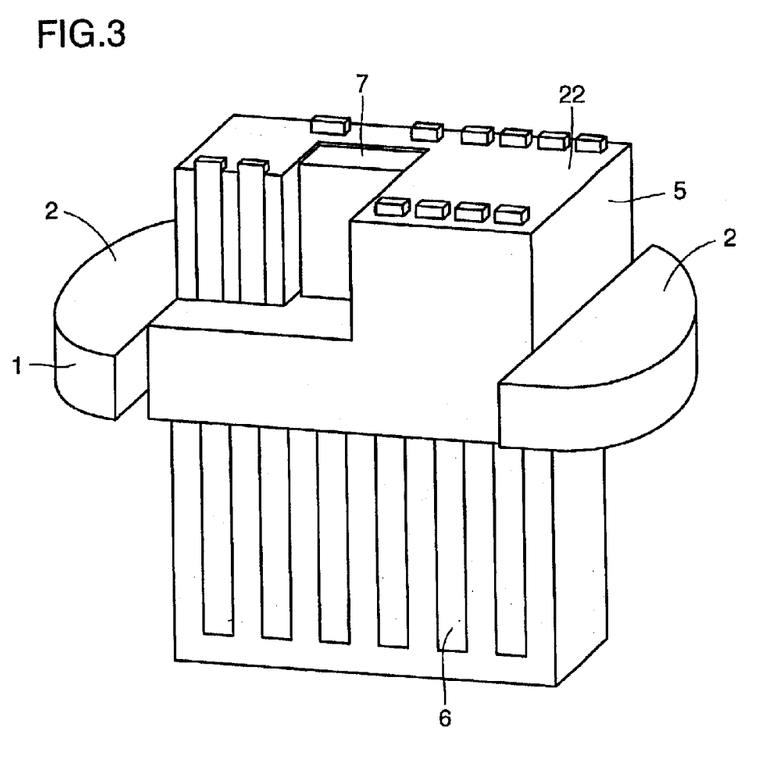

A fabrication method of a semiconductor laser package according to the present invention will be described here with reference to FIGS. 2 and 3.

First, island member 1 is formed integrally by cold forging. A metal plate is subjected to press-working to form a lead frame 9. By applying a bending process, a portion of lead frame 9 takes a configuration corresponding to lead 6. For the assembly of island member 1 and lead 6 held by lead frame 9 as shown in FIG. 2, island member 1 and lead 6 are disposed in a resin mold die (not shown). Integral molding is effected by the resin mold to obtain the structure shown in FIG. 3. Lead 6 is cut from the other portion of lead frame 9 before or after the resin mold process. Eventually, lead 6 is held by resin member 5 with a portion exposed, as shown in FIG. 3. As shown in FIG. 1, laser chip 3 is die-bonded to block member 7 via submount 21. Light receiving element 4 is die-bonded to light receiving unit attaching plane 22.

The required wire bonding is effected between the exposed portion of lead 6 located upper than base plane 2 and laser chip 3 or submount 21.

Figure 1:
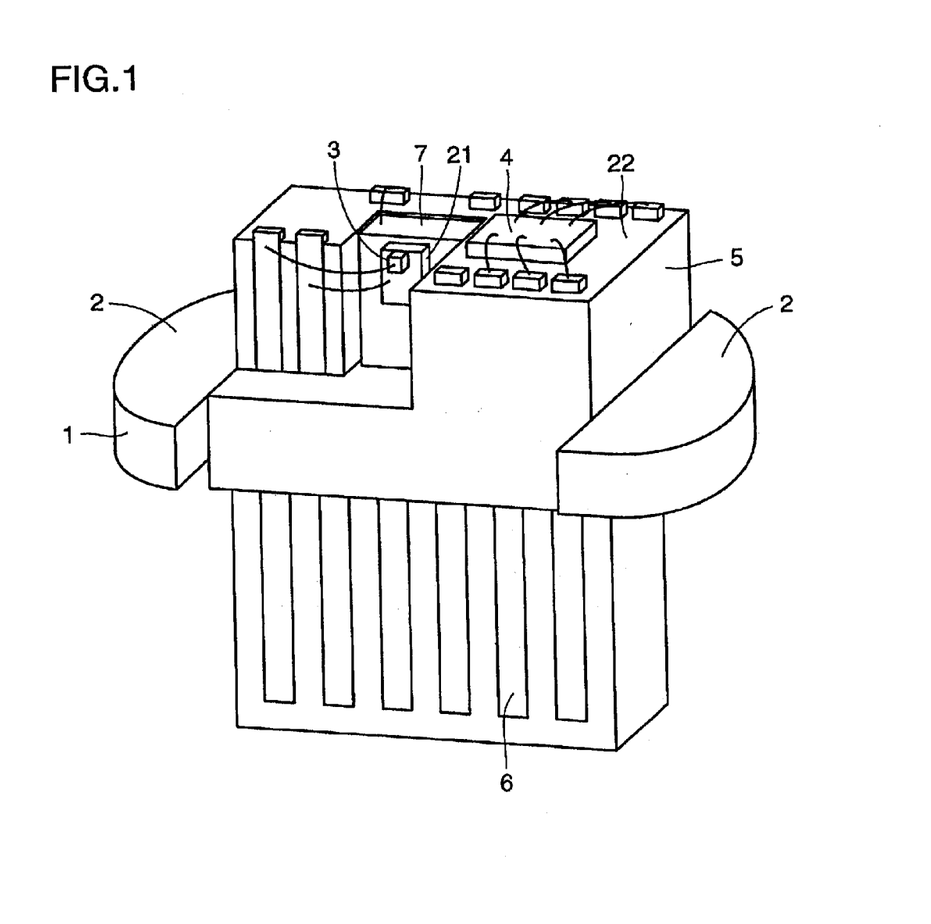
FIG. 1 is a perspective view of an example of a semiconductor laser package according to a first embodiment of the present invention.

Thus, the semiconductor laser package of FIG. 1 is obtained.

Figure 4:
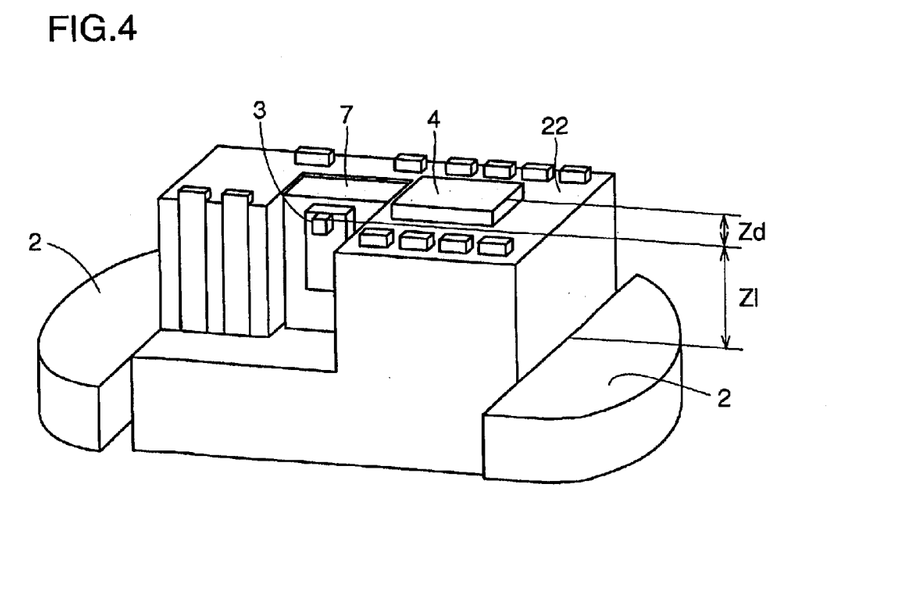
FIG. 4 is a perspective view of the main part of the semiconductor laser package of the first embodiment.

FIG. 4 shows the main part of the semiconductor laser package of the present embodiment. For the sake of simplification, wiring is not depicted in FIG. 4.

Since light receiving element 4 is directly mounted at light receiving unit attaching plane 22 corresponding to the top plane of resin member 5, the height of the light receiving plane of light receiving element 4 from base plane 2 can be determined depending upon the exact dimension of resin member 5, immune to the dimension of island member 1 formed by cold forging. Therefore, Zl can be set to approximate the design value by adjusting the attaching position of laser chip 3 while the dimension of resin member 5 can be adjusted so that Zd approximates the design value. The dimension of the resin molding die is to be adjusted in order to adjust the dimension of resin member 5. Since Zd and Zl are determined independent of each other, as compared to the conventional semiconductor laser package, Zl and Zd can be set closer to respective design values.

It is to be noted that lead 6 is not held by the two separated portions of resin members 55a and 55b as shown in FIG. 7. In the present embodiment, resin member 5 is formed integrally with the portion corresponding to the mounting region of light emitting element 4. Therefore, the portion of resin member 5 holding lead 6 can be made thick enough. Thus, the problem caused by insufficient holding of lead 6 can be eliminated.

It is to be also noted that light emitting element 4 is mounted, not at island member 1 that is conductive, but on a light receiving unit attaching plane 22 of resin member 5 which is a nonconductor. Therefore, it is not necessary to provide an insulator between light emitting element 4 and light emitting unit attaching plane 22 even in the case where electrical insulation is to be established between laser chip 3 and light receiving element 4. Light receiving element 4 only has to be fixed directly by means such as die bonding.

Figure 5:
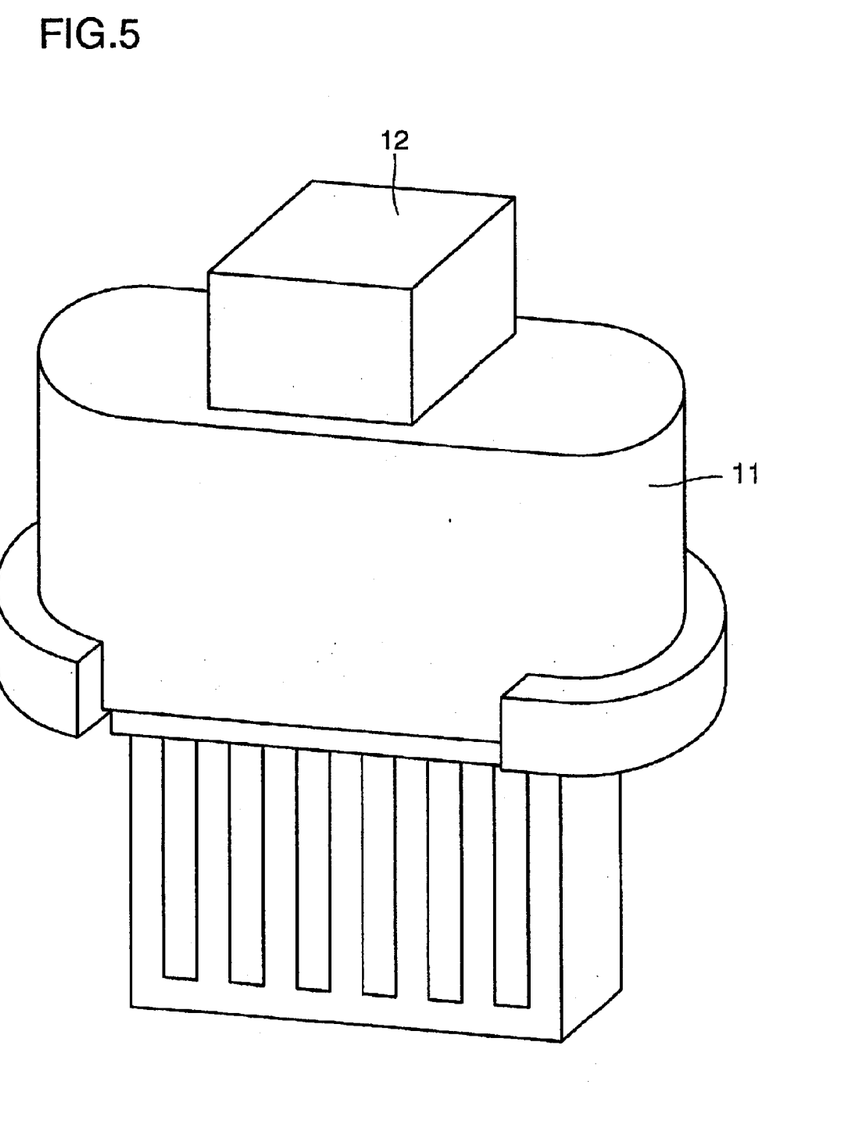
FIG. 5 is a perspective view of another example of the semiconductor laser package according to the first embodiment of the present invention.

When the semiconductor laser package is adapted to practical use, the semiconductor laser package is used, not in the state as shown in FIG. 1, but with a cap 11 provided, or with a hologram element 12 further provided on cap 11, as shown in FIG. 5. In this case, cap 11 is coupled by resistance welding. Hologram element 12 has its position on the top plane of cap 11 adjusted and fixed. Cap 11 has an opening at the region concealed below hologram element 12 in FIG. 5. The laser beam emitted upwards from laser chip 3 passes through this opening and also through hologram element 12 in the upward direction.

Second Embodiment

Figure 6:
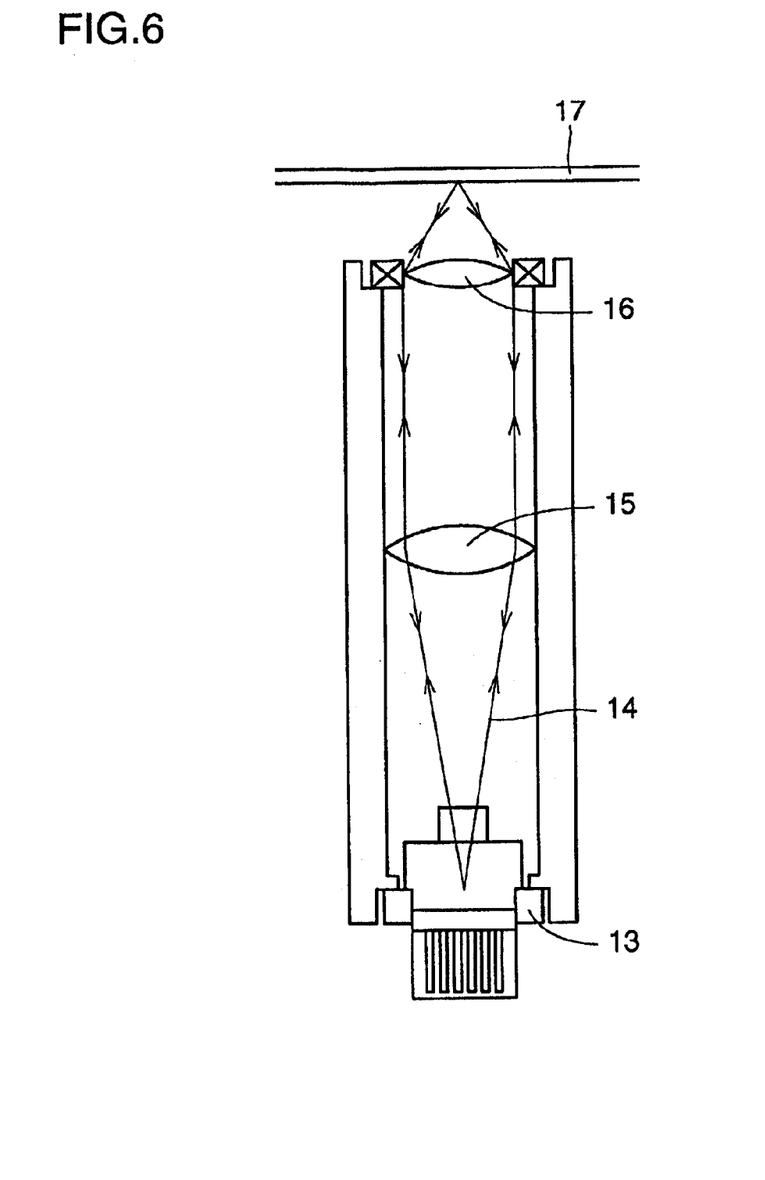
FIG. 6 is a schematic diagram of an optical pick up apparatus according to a second embodiment of the present invention.

An optical pick up apparatus according to a second embodiment of the present invention will be described with reference to FIG. 6. A semiconductor laser package including cap 11 and hologram element 12 as described in the previous first embodiment with reference to FIG. 5 is employed. This one configuration of a semiconductor laser package including cap 11 and hologram element 12 is particularly referred to as "a hologram laser package" in the present specification. A laser beam 14 emitted from hologram laser package 13 passes through a collimator lens 15 and then an objective lens 16 to be gathered on optical disc 17. The laser beam reflected from optical disc 17 passes through objective lens 16 and collimator lens 15 in an opposite order to return to hologram laser package 13.

The optical pick up apparatus of the present embodiment includes a semiconductor laser package of proper dimension with both Zl and Zd approximating respective design values as described in the previous first embodiment. Therefore, an optical pick up apparatus having superior characteristics can be provided without the balance of the focus signal being impaired. It is particularly preferable to have the focal point of collimator lens 15 match, or at least substantially match the light emitting point of laser chip 3.

According to the present invention, the laser chip is fixed to a block member of an island member whereas the light receiving unit is directly fixed to a resin member. Therefore, the position of the laser chip and the light receiving unit can be adjusted and determined independent of each other. Thus, a semiconductor laser package with the relative position between the laser chip and the light receiving unit set more closer to the design value can be provided. Since the light receiving unit is fixed to the resin member which is a nonconductive member, an insulator does not have to be inserted below the light receiving unit even when electrical insulation is to be established between the laser chip and the light receiving element. The light receiving element is just fixed by means such as die bonding.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser package comprising:
   an island member formed of metal, including a base plane and a block member protruding in a direction substantially perpendicular to said base plane,
   a plurality of leads substantially parallel to the block member,
   a one-piece resin member molded integrally with said island member and said leads so as to fix a relative position relationship between said island member and all said plurality of leads,
   a laser chip fixed at said block member so as to enable emission of a laser beam in a direction substantially perpendicular to said base plane, and
   a light receiving unit directly fixed at an outermost surface of said resin member.

2. The semiconductor laser package according to claim 1, wherein said resin member has a light receiving unit attaching plane substantially parallel to said base plane, and said light receiving unit is mounted at said light receiving unit attaching plane.

3. The semiconductor laser package according to claim 1, wherein a heat radiator is fixed at said block unit, and said laser chip is fixed to said block unit so as to form contact with said heat radiator.

4. The semiconductor laser package according to claim 3, wherein said heat radiator comprises light receiving means.

5. The semiconductor laser package according to claim 1, wherein a hologram element is arranged located on an optical path of a laser beam emitted from said laser chip.

6. The semiconductor laser package according to claim 1, comprising a cover to enclose said laser chip and said light receiving unit.

7. An optical pick up apparatus comprising a semiconductor laser package defined in claim 1, and a lens, wherein said lens is fixed so that a focal point substantially matches a light emitting point of said laser chip.

8. A fabrication method of a semiconductor laser package comprising:

a resin member molding step of molding a one-piece resin member integrally with an island member formed of metal, including a base plane and a block member protruding substantially in a direction of a normal line to said base plane, and all of a plurality of leads substantially parallel to the block member so as to fix a relative position relationship between said island member and all said plurality of leads, a laser chip attaching step of fixing a laser chip at said block member so as to enable emission of a laser beam in a direction of the normal line of said base plane, and a light receiving unit attaching step of fixing a light receiving unit at an outermost surface of said resin member.

9. The fabrication method of a semiconductor laser package according to claim 8, wherein said resin member molding step includes the step of arranging said island member and said lead in a same resin molding die and effect resin molding.

10. The fabrication method of a semiconductor laser package according to claim 8, further comprising an island member formation step of forming said island member by cold forging.

11. The fabrication method of a semiconductor laser package according to claim 8, wherein said leads are formed by shaping through press-working, and applying a bending process.

* * * * *